Figure 1:
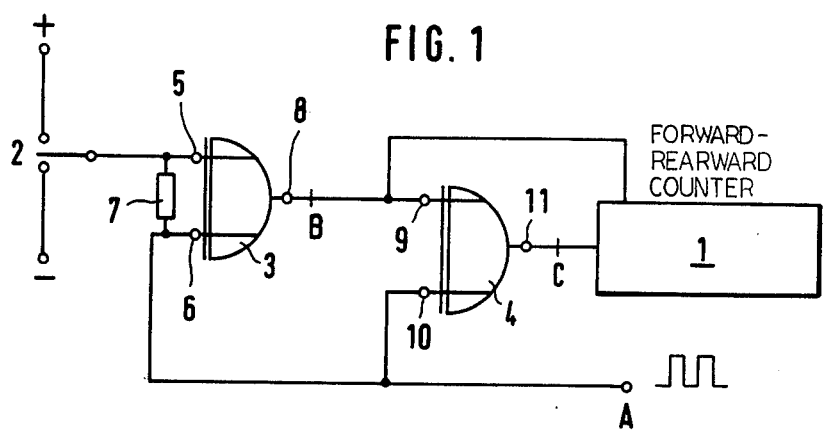

United States Patent [19]
Stein

[11] 4,132,905
[45] Jan. 2, 1979

[54] CIRCUIT ARRANGEMENT FOR THE CONTROL OF A FORWARD-REARWARD-COUNTER

[75] Inventor: Manfred Stein, Eschborn, Germany

[73] Assignee: VDO Adolf Schindling AG, Frankfurt am Main, Germany

[21] Appl. No.: 836,992

[22] Filed: Sep. 27, 1977

[30] Foreign Application Priority Data

Oct. 8, 1976 [DE] Fed. Rep. of Germany ....... 2645491

[51] Int. Cl.$^2$ ..................... H03K 21/30; H03K 19/32
[52] U.S. Cl. ........................... 307/247 A; 307/222 R; 328/44; 307/216
[58] Field of Search ......... 328/44; 307/247 A, 222 R, 307/216

[56] References Cited

U.S. PATENT DOCUMENTS

| 3,206,665 | 9/1965 | Burlingham | 328/44 X |
|---|---|---|---|
| 3,579,122 | 5/1971 | Paine | 328/44 X |
| 3,624,518 | 11/1971 | Dildy | 307/247 A |
| 3,624,649 | 11/1971 | Ranieri | 307/222 R |
| 4,028,560 | 6/1977 | Bainter | 307/247 A |

*Primary Examiner*—John S. Heyman
*Attorney, Agent, or Firm*—Martin A. Farber

[57] ABSTRACT

A circuit arrangement for the control of a forward-rearward-counter with at least one manually actuatable switch over which the reversing input of the counter can be triggered with different potential and the count input with count pulses. A first anticoincidence member has two inputs connected with one another over a resistor, one input being triggered via the switch. A second anticoincidence member has two inputs, one of which is in connection with the count input of the counter and with the output of the first anticoincidence member. The output of the second anticoincidence member is connected to the reversing input of the counter. Both anticoincidence members are applied with count pulses at their free inputs.

5 Claims, 2 Drawing Figures

CIRCUIT ARRANGEMENT FOR THE CONTROL OF A FORWARD-REARWARD-COUNTER

The invention relates to a circuit arrangement for the control of a forward-rearward-counter with at least one manually actuable switch, by means of which the change-over or reversing input of the counter can be applied or triggered with different potential and the count input can be applied or triggered with count pulses.

It is already known to use two switches for the control of a rearward-forward-counter, of which one of the switches is provided for the switching-on and switching-off, respectively, of the count pulses, and the other switch is provided for locking a positive potential or zero potential on the reversing or switching change-over input. The switches can be formed as push-button switches, tumbler or toggle switches, turn switches, or slider switches. Such type of systems with two switches has the disadvantage that basically two switches must be actuated for the adjustment or setting of the forward-rearward-counter, which causes disadvantages in the operation and handling. Beyond that, for example, on the grounds of space considerations, it is necessary to closely arrange the switches next to one another — with alarm clocks among others this is the case, by which the forward-rearward-counter is provided for setting the alarm time —, thus making the operability or handling further worse, and erroneous settings can not be avoided.

Furthermore it is known for the control of a forward-rearward-counter to provide a single change-over or reversing switch with a central or neutral position, by means of which the counter can be brought to a first switching position in a forward running condition, to a second switching position in a rearward running condition, and in the central or neutral position for the inoperative stopping condition. With such a system, still only a single switch is to be operated, which considerably makes the manipulation and handling easier and permits a quick and exact adjustment and setting of a definite value. Of disadvantage, however, is that such a system permits realization or operation only with a forward-rearward-counter which has two separated reversing or switch-over inputs. These counters are rather comparatively expensive.

It is an object of the present invention to overcome the above mentioned disadvantages. It is another object and task of the invention thus to provide a switching or circuit arrangement for the control of a forward-rearward-counter, with which a quick and exact adjustment or setting of the counter can be made to a desired value, whereby the necessary expense therefor should be as low as possible.

It is another object of the present invention to aid the solution of the above-mentioned objective, in the manner that there are provided a first anticoincidence member (3) with two inputs (5, 6) connected with one another over a resistor (7), of which inputs one is triggered via the switch (2), and a second anticoincidence member (4) with two inputs (9, 10), one of which latter inputs stands in connection with the count input of the counter (1) and with the output (8) of the first anticoincidence member (3), and the output (11) of the second anticoincidence member is connected to the change-over or reversing input of the counter (1), and both anticoincidence members (3, 4) are applied with count pulses at their free inputs (6, 10).

By such a type of circuit wiring of the forward-rearward-counter the following is achieved. A single switch can be used for the control of the forward-rearward-counter, without requiring an expensive counter with two separated change-over or reversing inputs. The cost for the circuit arrangement in integrated circuit construction is far less than the amount by which a forward-rearward-counter with two separated reversing inputs is more expensive than a forward-rearward-counter with a single reversing input.

In a preferred embodiment form of the invention, for control of the counter, one rocker type push-button switch is provided, which in a first operating position places the anticoincidence member input at a positive potential, and in a second operating position places it at a zero potential. Such a type of rocker type push-button switch, compared with other switches has the advantage that the setting of the counter can be performed particularly quickly and precisely. Such an embodiment form is consequently suited to a special degree for electronic alarm clocks which depend on prompt and rapid setting and adjustability and small construction volumes of the circuit and switching arrangement.

Figure 2:
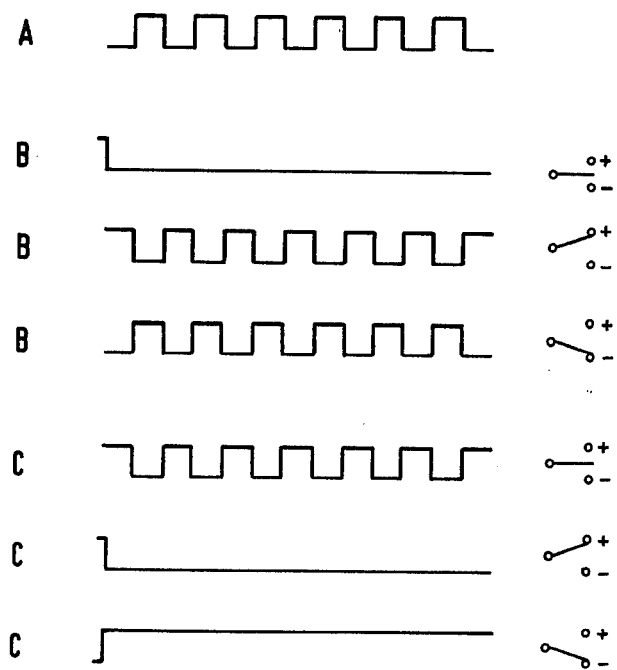

With the above and other objects and advantages in view, the present invention will become more clearly understood from the following detailed description of a preferred embodiment of the invention in connection with the accompanying drawing, of which:

FIG. 1 is a circuit diagram of the circuit and switching arrangement in accordance with the present invention; and FIG. 2 is a time signal - course diagram at certain corresponding points of the circuit arrangement according to FIG. 1 with the corresponding positions of the rocker type push-button switch schematically indicated at the right.

Referring now to FIG. 1 of the drawing, the circuit arrangement for the control of the forward-rearward-counter 1 comprises one rocker type push-button switch 2 and two anticoincidence members 3 and 4. The anticoincidence member 3 can be applied with a positive potential and a zero potential on one input 5 thereof by means of the switch 2, and the other input 6 is fed with the count pulses A. Both inputs 5 and 6 are connected with one another over a high-ohm resistor 7.

The output 8 of the anticoincidence member 3 on the one hand is connected to the input 9 of the anticoincidence member 4, the other input 10 of the anticoincidence member 4 receiving the count pulses A, and on the other hand the output 8 of the anticoincidence member 3 is connected to the count input of the counter 1.

The output 11 of the anticoincidence member 4 is connected with the reversing or change-over input of the counter 1.

The free inputs 6 and 10 of the anticoincidence members 3 and 4 receive counting pulses A, for example, from a timer signal-transmitting unit of an electronic clock.

If the rocker type push-button switch 2 is disposed in the illustrated neutral initial inoperative position, thus as may be seen from FIG. 2 (which illustrates the signals at correspondingly labeled portions of the circuit of FIG. 1), a low signal appears on the output 8 (uppermost illustrated signal B in FIG. 2) of the anticoincidence member 3, while at the output 11 (uppermost illustrated signal C) of the anticoincidence member 4 there appears an oscillating signal alternating between low and high. The result is that the counting mode of the counter 1 is continuously reversed, which however, causes no disturbance since no count pulses are read in since the output 8 of the anticoincidence member 3 and thus the count input of the counter 1 are held at a constant potential.

If the rocker type push-button switch 2 is actuated such that a positive potential is applied at the input 5 of the anticoincidence member 3, thus count pulses (the second illustrated signal B from the bottom) appear at the output 8, which count pulses are read into the counter 1. A low signal (lowermost illustrated signal C) appears at the output 11 of the anticoincidence member 4, whereby the counter is switched and locked into the forward- or rearward- mode, respectively.

If by a corresponding actuation of the rocker type push-button switch 2 the input 5 of the anticoincidence member 3 is set to zero potential (−), the output 8 again sends count pulses (lowermost illustrated signal B) to the count input of the counter 1. Now however a high signal (the lowermost illustrated signal C) appears at the output 11 of the anticoincidence member 4, by which high signal the counter 1 is switched and locked into a rearward- or forward- mode, respectively.

While there has been disclosed one embodiment of the invention, it is to be understood that this embodiment is given by example only and not in a limiting sense.

I claim:

1. A circuit arrangement for control of a forward-rearward-counter with at least one manually actuatable switch over which the reversing input of the counter can be applied with different potential and the count input with count pulses, comprising a first anticoincidence member having two first inputs and a first output, a high-ohm resistor connected across said two first inputs, a second anticoincidence member having two second inputs and a second output, one of said second inputs of said second anticoincidence member is connected to said first output of said first anticoincidence member, a counter having a reversing input connected to said second output of said second anticoincidence member and having a count input connected to said one of said second inputs of said second anticoincidence member, switch means for operatively triggering one of said first inputs of said first anticoincidence member, the other of said first inputs of said first anticoincidence member and the other of said second inputs of said second anticoincidence member being adapted to receive counting pulses.

2. The circuit arrangement, as set forth in claim 1, wherein said switch means is a rocker type push-button switch having a first operating position in which a positive potential is applied to said one of said first inputs of said first anticoincidence member, and a second operating position in which a zero potential is applied to said one of said first inputs of said first anticoincidence member.

3. The circuit arrangement, as set forth in claim 2, wherein said rocker type push-button switch also has an inoperative neutral position.

4. The circuit arrangement, as set forth in claim 2, wherein said switch means constitutes a single rocker type push-button switch.

5. The circuit arrangement, as set forth in claim 1, wherein said switch means constitutes a single switch.

* * * * *